US 9,804,991 B2

(12) United States Patent
Winemiller et al.

(10) Patent No.: US 9,804,991 B2
(45) Date of Patent: Oct. 31, 2017

(54) HIGH-FREQUENCY SIGNAL OBSERVATIONS IN ELECTRONIC SYSTEMS

(71) Applicant: QUALCOMM Incorporated, San Diego, CA (US)

(72) Inventors: Chad Everett Winemiller, Cary, NC (US); Jon Raymond Boyette, Holly Springs, NC (US); Russell Coleman Deans, Chapel Hill, NC (US)

(73) Assignee: QUALCOMM Incorporated, San Diego, CA (US)

( * ) Notice: Subject to any disclaimer, the term of this patent is extended or adjusted under 35 U.S.C. 154(b) by 335 days.

(21) Appl. No.: 14/636,504

(22) Filed: Mar. 3, 2015

(65) Prior Publication Data
US 2016/0259755 A1  Sep. 8, 2016

(51) Int. Cl.
*G06F 13/42* (2006.01)
*G06F 13/40* (2006.01)
*G01R 31/317* (2006.01)

(52) U.S. Cl.
CPC ... *G06F 13/4282* (2013.01); *G01R 31/31705* (2013.01); *G06F 13/4027* (2013.01)

(58) Field of Classification Search
None
See application file for complete search history.

(56) References Cited

U.S. PATENT DOCUMENTS

| 6,260,166 | B1 | 7/2001 | Bhavsar et al. |
| 7,860,203 | B1 | 12/2010 | Shumarayev et al. |
| 8,117,587 | B1 * | 2/2012 | Testardi ............. G06F 8/447 |
| | | | 717/100 |

(Continued)

OTHER PUBLICATIONS

International Preliminary Report on Patentability for PCT/US2016/016702, dated Feb. 17, 2017, 31 pages.

(Continued)

*Primary Examiner* — Henry Tsai
*Assistant Examiner* — Christopher Bartels
(74) *Attorney, Agent, or Firm* — Withrow & Terranova, PLLC

(57) ABSTRACT

Aspects disclosed in the detailed description include high-frequency signal observations in electronic systems. In this regard, a high-frequency signal observation circuit is provided in an electronic system to enable high-frequency signal observations. In one aspect, the high-frequency signal observation circuit comprises an observation signal selection circuit. The observation signal selection circuit is programmably controlled to select an observation signal among a plurality of electronic input signals (e.g., control signals) received from the electronic system. In another aspect, the high-frequency signal observation circuit is configured to utilize a bypass data path, which is routed around serializer/deserializer (SerDes) logic in the electronic system, to output the observation signal for observation. By programmably selecting the observation signal and outputting the observation signal via the bypass data path, it is possible to examine accurately any high-frequency signal (e.g., high-frequency clock signal) in the electronic system with minimized delay and/or degradation in the high-frequency signal.

23 Claims, 6 Drawing Sheets

(56) References Cited

U.S. PATENT DOCUMENTS

| | | | |
|---|---|---|---|
| 8,397,013 B1* | 3/2013 | Rosenband | G06F 13/385 |
| | | | 365/205 |
| 8,755,675 B2 | 6/2014 | Direnzo et al. | |
| 2005/0066232 A1 | 3/2005 | Ueda et al. | |
| 2005/0289418 A1 | 12/2005 | Agarwal | |
| 2007/0019687 A1* | 1/2007 | Ruthstein | H04J 3/076 |
| | | | 370/537 |
| 2008/0192814 A1* | 8/2008 | Hafed | G01R 31/31711 |
| | | | 375/224 |
| 2008/0291855 A1* | 11/2008 | Bata | H04W 84/18 |
| | | | 370/311 |
| 2009/0307592 A1* | 12/2009 | Kalanithi | G06F 3/002 |
| | | | 715/716 |
| 2013/0339790 A1 | 12/2013 | Menon et al. | |
| 2014/0101500 A1 | 4/2014 | Bastimane et al. | |
| 2015/0097084 A1* | 4/2015 | Szabo | B64G 1/1078 |
| | | | 244/171.1 |
| 2016/0259755 A1* | 9/2016 | Winemiller | G06F 13/4027 |
| 2016/0269034 A1* | 9/2016 | Winemiller | G06F 1/12 |

OTHER PUBLICATIONS

Akselrod, Dimitry et al., "Platform Independent Debug Port Controller Architecture with Security Protection for Multi-Processor System-on-Chip ICs," Proceedings of the Design Automation & Test in Europe Conference, vol. 2, Mar. 6, 2006, IEEE, 6 pages.
International Search Report and Written Opinion for PCT/US2016/016702, dated May 6, 2016, 12 pages.

* cited by examiner

HIGH-FREQUENCY SIGNAL OBSERVATIONS IN ELECTRONIC SYSTEMS

BACKGROUND

I. Field of the Disclosure

The technology of the disclosure relates generally to debugging an electronic system.

II. Background

Mobile computing devices have become common in modern society. The prevalence of mobile computing devices may be attributed to the many functions that are enabled within such computing devices. Increasingly complex integrated circuits (ICs) have been designed and manufactured to provide increasingly greater functionality in mobile computing devices. In some cases, an entire system of a mobile computing device is integrated into a single IC known as a system-on-chip (SOC). In some other cases, the entire system of the mobile computing device is supported by multiple ICs that are packaged into an integrated module known as system-in-package (SIP).

ICs and mobile computing devices are repeatedly tested and debugged during different phases of their respective development life cycles in an effort to detect and eliminate potential errors before releasing the mobile computing devices to customers. While testing is a process for detecting suspected errors under specific conditions, debugging is a process used to investigate the exact causes of the suspected errors. In the case of debugging mobile computing devices, a conventional approach involves aggregating electronic signals received from various components, ICs, and/or functional blocks in the mobile computing device into a combined debug signal for observation over a debug interface. Because signal aggregation typically requires multiple levels of multiplexing, higher frequency signals may be severely degraded as a result of increased wire routes and aggregation delays.

As data transmission speed of the mobile computing devices continue to increase, designers and developers of mobile computing devices require better debugging techniques to observe and analyze higher frequency signals associated with high-speed data transmissions.

SUMMARY OF THE DISCLOSURE

Aspects disclosed in the detailed description include high-frequency signal observations in electronic systems. In this regard, a high-frequency signal observation circuit is provided in an electronic system to enable high-frequency signal observations. In one aspect, the high-frequency signal observation circuit comprises an observation signal selection circuit. The observation signal selection circuit is programmably controlled to select an observation signal among a plurality of electronic input signals (e.g., control signals) received from the electronic system. In another aspect, the high-frequency signal observation circuit is configured to utilize a bypass data path, which is routed around a serializer/deserializer (SerDes) logic in the electronic system, to output the observation signal for observation. By programmably selecting the observation signal and outputting the observation signal via the bypass data path, it is possible to examine accurately any high-frequency signal (e.g., a high-frequency clock signal) in the electronic system with a minimized delay and/or degradation in the high-frequency signal, thus leading to robust high-speed input/output (I/O) performance in the electronic system.

In this regard, in one aspect, a high-frequency signal observation circuit is provided. The high-frequency signal observation circuit comprises an observation signal selection circuit communicatively coupled to a high-speed I/O circuit via a bypass data path. The observation signal selection circuit is configured to receive a plurality of electronic input signals. The high-frequency signal observation circuit also comprises a signal control logic coupled to the observation signal selection circuit and the high-speed I/O circuit. The signal control logic is configured to provide one or more selection control signals to the observation signal selection circuit to select an observation signal among the plurality of electronic input signals. The signal control logic is also configured to control the observation signal selection circuit to provide the observation signal to the high-speed I/O circuit via the bypass data path. The signal control logic is also configured to provide a first output control signal to the high-speed I/O circuit to output the observation signal as an electronic output signal.

In another aspect, a high-frequency signal observation circuit is provided. The high-frequency signal observation circuit comprises a means for selecting an observation signal. The means for selecting the observation signal is communicatively coupled to a high-speed I/O circuit via a bypass data path. The means for selecting the observation signal is configured to receive a plurality of electronic input signals. The high-frequency signal observation circuit also comprises a means for providing a control signal. The means for providing the control signal is coupled to the means for selecting the observation signal and the high-speed I/O circuit. The means for providing the control signal is configured to provide one or more selection control signals to the means for selecting the observation signal to select the observation signal among the plurality of electronic input signals. The means for providing the control signal is also configured to control the means for selecting the observation signal to provide the observation signal to the high-speed I/O circuit via the bypass data path. The means for providing the control signal is also configured to provide a first output control signal to the high-speed I/O circuit to output the observation signal as an electronic output signal.

In another aspect, a method for observing a high-frequency signal in an electronic system is provided. The method comprises configuring an observation signal selection circuit to receive a plurality of electronic input signals. The method also comprises providing one or more selection control signals from a signal control logic to the observation signal selection circuit to select an observation signal among the plurality of electronic input signals. The method also comprises outputting the observation signal to a high-speed I/O circuit via a bypass data path. The method also comprises providing a first output control signal from the signal control logic to the high-speed I/O circuit to output the observation signal.

In another aspect, an electronic system configured to enable high-frequency signal observation is provided. The electronic system comprises a high-frequency signal observation circuit. The high-frequency signal observation circuit comprises a high-speed I/O circuit configured to output an electronic output signal from an electronic system. The high-frequency signal observation circuit also comprises an observation signal selection circuit coupled to the high-speed I/O circuit via a bypass data path. The observation signal selection circuit is configured to receive a plurality of electronic input signals from the electronic system. The high-frequency signal observation circuit also comprises a signal control logic coupled to the observation signal selection circuit and the high-speed I/O circuit. The signal control logic is configured to provide one or more selection control signals to the observation signal selection circuit to select an observation signal among the plurality of electronic input signals. The signal control logic is also configured to control the observation signal selection circuit to provide the observation signal to the high-speed I/O circuit via the bypass data path. The signal control logic is also configured to provide a first output control signal to the high-speed I/O circuit to output the observation signal as the electronic output signal.

DETAILED DESCRIPTION

Figure 1:
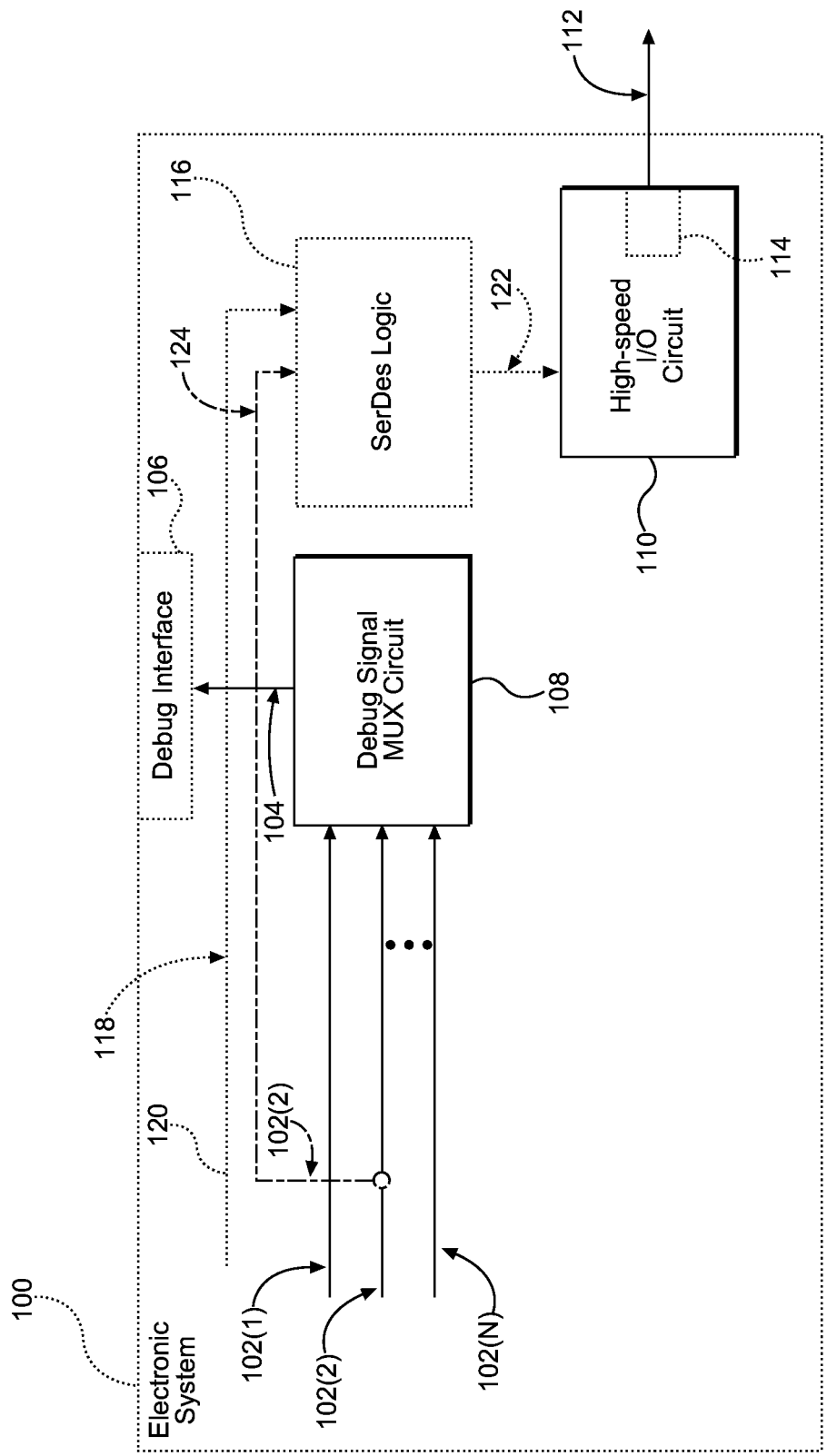
FIG. 1 is a schematic diagram of an exemplary electronic system configured to support a conventional debugging approach by aggregating a plurality of electronic input signals received from the electronic system into a combined debug signal.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include high-frequency signal observations in electronic systems. In this regard, a high-frequency signal observation circuit is provided in an electronic system to enable high-frequency signal observations. In one aspect, the high-frequency signal observation circuit comprises an observation signal selection circuit. The observation signal selection circuit is programmably controlled to select an observation signal among a plurality of electronic input signals (e.g., control signals) received from the electronic system. In another aspect, the high-frequency signal observation circuit is configured to utilize a bypass data path, which is routed around a serializer/deserializer (SerDes) logic in the electronic system, to output the observation signal for observation. By programmably selecting the observation signal and outputting the observation signal via the bypass data path, it is possible to examine accurately any high-frequency signal (e.g., a high-frequency clock signal) in the electronic system with a minimized delay and/or degradation in the high-frequency signal, thus leading to robust high-speed input/output (I/O) performance in the electronic system.

Before discussing aspects of a high-frequency signal observation circuit in an electronic system that includes specific aspects of the present disclosure, a brief overview of a conventional approach for debugging the electronic system that may benefit from exemplary aspects of the present disclosure is provided with reference to FIG. 1. The discussion of specific exemplary aspects of the high-frequency signal observation circuit starts below with reference to FIG. 2.

In this regard, FIG. 1 is a schematic diagram of an exemplary electronic system 100 configured to support a conventional debug approach by aggregating a plurality of electronic input signals 102(1)-102(N) received from the electronic system 100 into a combined debug signal 104.

With reference to FIG. 1, the electronic system 100 is configured to provide the combined debug signal 104 to a debug interface 106. In a non-limiting example, the debug interface 106 may be a universal serial bus (USB) interface, a joint test action group (JTAG) interface, a serial wire debug (SWD) interface, a system trace interface, or a universal asynchronous receiver/transmitter (UART) interface. A debug signal multiplexer (MUX) circuit 108 in the electronic system 100 receives the plurality of electronic input signals 102(1)-102(N) from various components (not shown), integrated circuits (ICs) (not shown), and/or functional blocks (not shown) in the electronic system 100. In a non-limiting example, the plurality of electronic input signals 102(1)-102(N) may comprise one or more data signals (not shown) and one or more control signals (e.g., clock signals) (not shown). The plurality of electronic input signals 102(1)-102(N) may operate at various frequencies. The debug signal MUX circuit 108 may comprise multiple levels of MUXs (not shown) configured to aggregate the plurality of electronic input signals 102(1)-102(N) into the combined debug signal 104 and provide the combined debug signal 104 to the debug interface 106.

With continuing reference to FIG. 1, the electronic system 100 also includes a high-speed I/O circuit 110 configured to output an electronic output signal 112 via an analog transmitter 114. In a non-limiting example, the high-speed I/O circuit 110 may be provided as a peripheral component interconnect express (PCIe) circuit, a USB circuit, or a wireless communications circuit such as wireless gigabyte (WiGig). The high-speed I/O circuit 110 is configured to transmit the electronic output signal 112 to a point-to-point (P2P) receiver (not shown) at a very high data rate. For instance, as a non-limiting example, if the high-speed I/O circuit 110 is provided as a PCIe generation four (gen 4) circuit, then the high-speed I/O circuit 110 can transmit the electronic output signal 112 at a peak data rate of sixteen (16) gigabit-per-second (Gbps). In another non-limiting example, the high-speed I/O circuit 110 may also be a high definition multimedia interface (HDMI) circuit, a universal flash storage (UFS) circuit, or a serial advanced technology attachment (SATA) circuit. When the peak data rate of the high-speed I/O circuit 110 increases, it becomes more difficult to transmit the electronic output signal 112 to the P2P receiver over parallel transmission buses or channels (not shown). For example, it is difficult to maintain comparable skew between the parallel transmission buses or channels to ensure correct data reception at the P2P receiver. Furthermore, power consumption will increase significantly as a result of fast switching between the parallel transmission buses or channels during transmission and reception. As such, the high-speed I/O circuit 110 is typically configured to transmit the electronic output signal 112 to the P2P receiver over a serial bus or channel (not shown).

With continuing reference to FIG. 1, the electronic system 100 also comprises a serializer/deserializer (SerDes) logic 116. The SerDes logic 116 is configured to receive at least one parallelized data input signal 118 over a parallel data bus 120 that comprises a plurality of data lanes (not shown). As discussed above, the high-speed I/O circuit 110 is typically configured to transmit the electronic output signal 112 to the P2P receiver over the serial bus or channel. In this regard, the SerDes logic 116 is configured to convert the at least one parallelized data input signal 118 into a serialized data signal 122 for transmission by the high-speed I/O circuit 110. The process of turning the at least one parallelized data input signal 118 into the serialized data signal 122 is known as serialization. To serialize the at least one parallelized data input signal 118, the SerDes logic 116 requires at least one reference signal 124 that is clocked at a higher frequency than the at least one parallelized data input signal 118. For example, if the at least one parallelized data input signal 118 is provided to the SerDes logic 116 over four (4) data lanes in the parallel data bus 120 and each of the 4 data lanes operates at two hundred (200) megahertz (MHz), then the at least one reference signal 124 must clock at least eight hundred (800) MHz. For the convenience of reference and illustration, the at least one reference signal 124 is hereinafter referred to as at least one high-frequency clock signal 102(2), which is among the plurality of electronic input signals 102(1)-102(N), as a non-limiting example.

With continuing reference to FIG. 1, in a non-limiting example, performance of the SerDes logic 116, and ultimately the high-speed I/O circuit 110, is determined by the quality of the high-frequency clock signal 102(2). It is thus desirable to debug the high-speed I/O circuit 110 and/or the SerDes logic 116 in conjunction with an examination of control signals such as the high-frequency clock signal 102(2) or other clock signals to the SerDes logic 116. However, in the conventional electronic system 100, the high-frequency clock signal 102(2) is aggregated into the combined debug signal 104 with the rest of the plurality of electronic input signals 102(1)-102(N). Further, the high-frequency clock signal 102(2) may be severely degraded after going through the multiple levels of MUXs in the debug signal MUX circuit 108. As a result, it is difficult to examine a true quality of the high-frequency clock signal 102(2) in the conventional electronic system 100.

Figure 2:
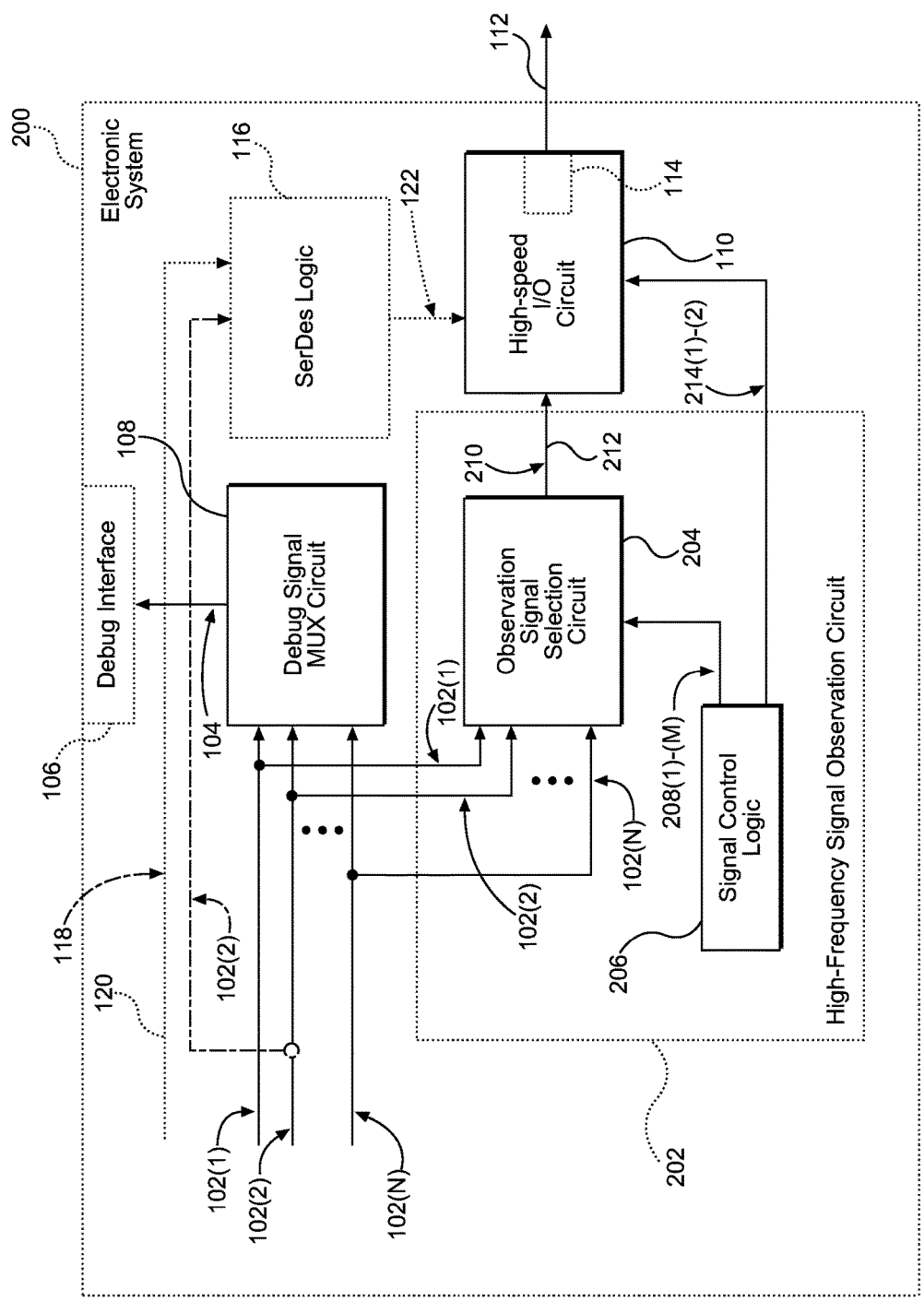
FIG. 2 is a schematic diagram of an exemplary electronic system configured to support observation of a high-frequency clock signal without degrading the high-frequency clock signal.

In this regard, FIG. 2 is a schematic diagram of an exemplary electronic system 200 configured to support observation of the high-frequency clock signal 102(2) in FIG. 1 while minimizing degradation in the high-frequency clock signal 102(2). Common elements between FIGS. 1 and 2 are shown therein with common element numbers, thus will not be re-described herein.

With reference to FIG. 2, the electronic system 200 comprises a high-frequency signal observation circuit 202, which further comprises an observation signal selection circuit 204 and a signal control logic 206. In addition, the high-frequency signal observation circuit 202 comprises the high-speed I/O circuit 110. The observation signal selection circuit 204 provides a means for selecting an observation signal 210. The signal control logic 206 provides a means for providing a control signal. The observation signal selection circuit 204 is configured to receive the plurality of electronic input signals 102(1)-102(N) before the plurality of electronic input signals 102(1)-102(N) are aggregated into the combined debug signal 104. In this regard, the observation signal selection circuit 204 and the debug signal MUX circuit 108 are configured to receive the plurality of electronic input signals 102(1)-102(N) concurrently. The observation signal selection circuit 204 is coupled to the signal control logic 206 to receive one or more selection control signals 208(1)-(M). The one or more selection control signals 208(1)-(M) control the observation signal selection circuit 204 to select an observation signal 210 among the plurality of electronic input signals 102(1)-102(N). In a non-limiting example, the signal control logic 206 is provided as a programmable register to generate programmably the one or more selection control signals 208(1)-(M). In this regard, any of the plurality of electronic input signals 102(1)-102(N) may be selected as the observation signal 210. Accordingly, to examine the quality of the high-frequency clock signal 102(2), the signal control logic 206 may be programmed to select the high-frequency clock signal 102(2) as the observation signal 210.

With continuing reference to FIG. 2, the observation signal 210 is output from the electronic system 200 for observation via the high-speed I/O circuit 110. To minimize degradation to the observation signal 210, the observation signal selection circuit 204 is configured to provide the observation signal 210 to the high-speed I/O circuit 110 via a bypass data path 212. In a non-limiting example, the bypass data path 212 may be provided in the electronic system 200 to support a JTAG boundary scan. The bypass data path 212 is purposely routed around (e.g., bypass) the SerDes logic 116 to minimize degradation to the observation signal 210. As a result of utilizing the bypass data path 212, the observation signal 210 is provided from the observation signal selection circuit 204 to the high-speed I/O circuit 110 with minimized latency and degradation that would have been introduced by the debug signal MUX circuit 108 and the debug interface 106.

As previously discussed in FIG. 1, the high-speed I/O circuit 110 is also configured to receive and transmit the serialized data signal 122. In this regard, the high-speed I/O circuit 110 must be controlled properly to switch between transmission of the observation signal 210 and transmission of the serialized data signal 122. Accordingly, the signal control logic 206 is configured to provide an output control signal 214 to the high-speed I/O circuit 110. The output control signal 214 instructs the high-speed I/O circuit 110 to output either the observation signal 210 or the serialized data signal 122. As used herein, when the output control signal 214 instructs the high-speed I/O circuit 110 to output the observation signal 210, the output control signal 214 is referred to as a first output control signal 214(1). When the output control signal 214 instructs the high-speed I/O circuit 110 to output the serialized data signal 122, the output control signal 214 is referred to as a second output control signal 214(2). By programmably selecting the observation signal 210 and outputting the observation signal 210 via the bypass data path 212, it is possible to examine accurately any high-frequency signal, such as the high-frequency clock signal 102(2), in the electronic system 200 with a minimized delay and/or degradation in the high-frequency signal.

Figure 3:
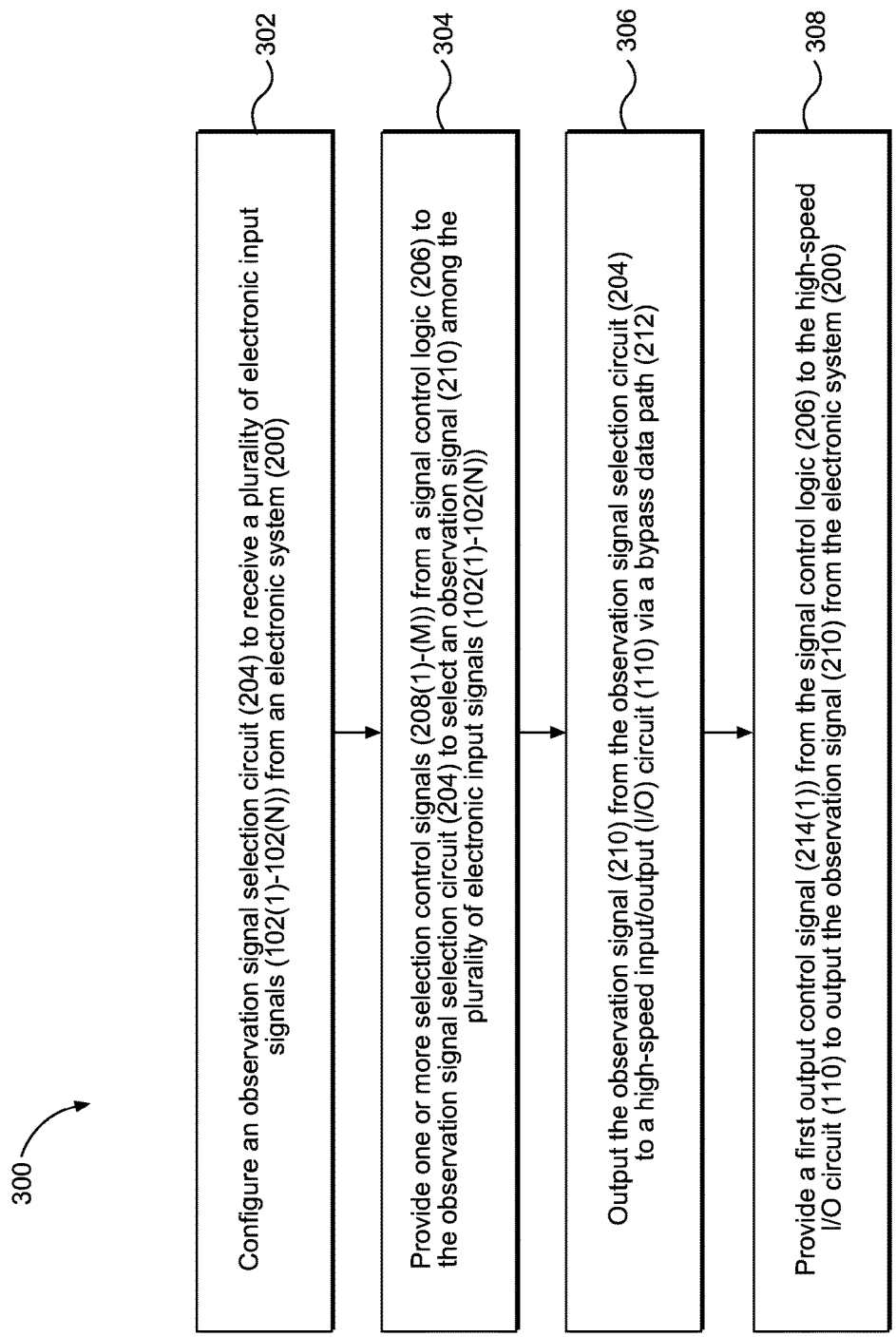
FIG. 3 is a flowchart illustrating an exemplary signal observation process for selecting and outputting an observation signal, which may be the high-frequency clock signal in FIG. 2, from the electronic system of FIG. 2.

In this regard, FIG. 3 is a flowchart illustrating an exemplary signal observation process 300 for selecting and outputting the observation signal 210, which may be the high-frequency clock signal 102(2), from the electronic system 200 of FIG. 2. Elements of FIG. 2 are referenced in connection with FIG. 3 and will not be re-described herein.

With reference to FIG. 3, the observation signal selection circuit 204 is configured to receive the plurality of electronic input signals 102(1)-102(N) from the electronic system 200 (block 302). Next, the signal control logic 206 is configured to provide the one or more selection control signals 208(1)-(M) to the observation signal selection circuit 204 to select the observation signal 210 among the plurality of electronic input signals 102(1)-102(N) (block 304). Subsequently, the observation signal 210 is output from the observation signal selection circuit 204 to the high-speed I/O circuit 110 via the bypass data path 212 (block 306). Finally, the signal control logic 206 is configured to provide the first output control signal 214(1) to the high-speed I/O circuit 110 to output the observation signal 210 from the electronic system 200 (block 308).

Figure 4:
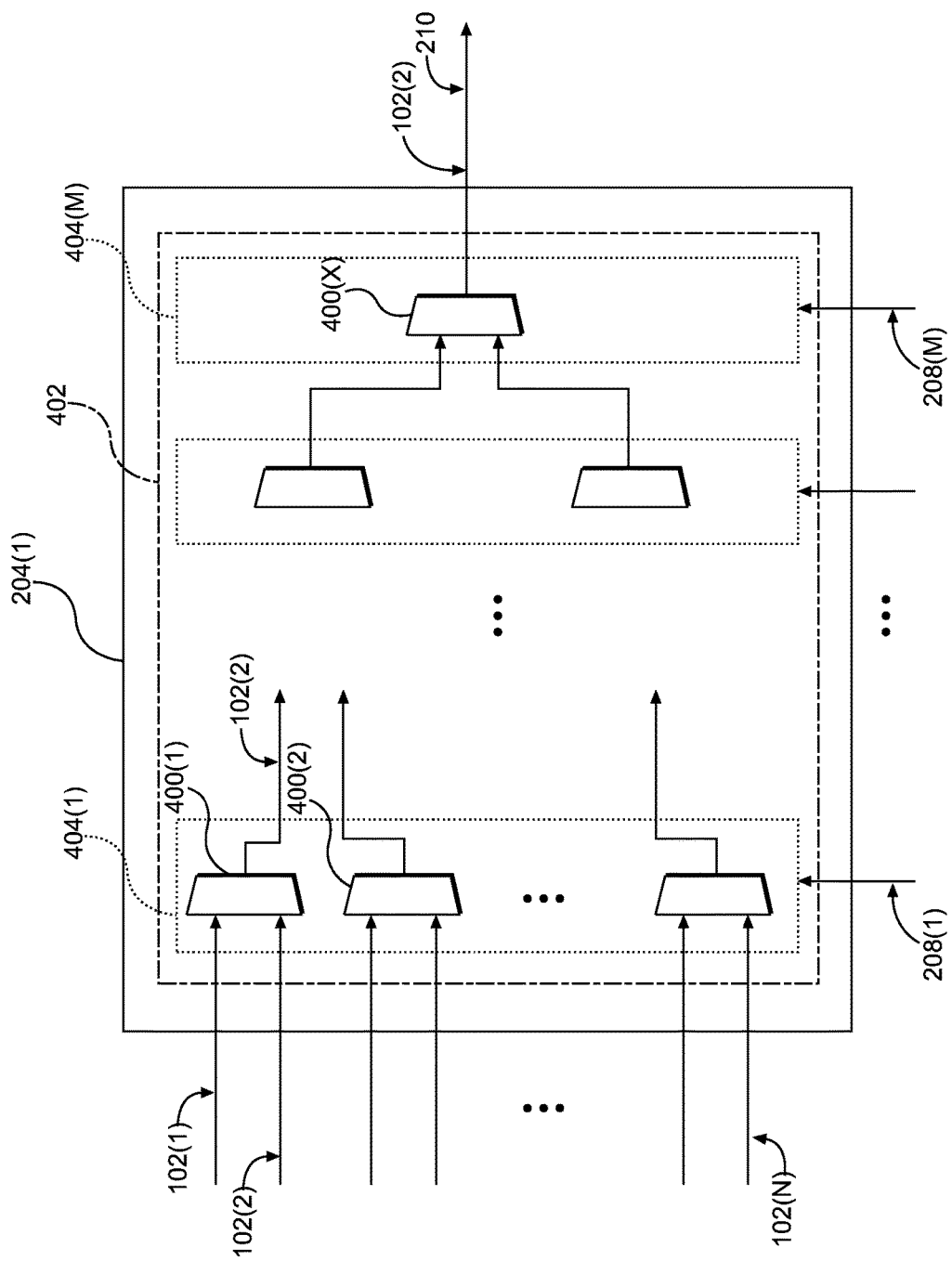
FIG. 4 is a schematic diagram of an exemplary observation signal selection circuit configured to utilize a plurality of low-distortion multiplexers (MUXs) to select the high-frequency clock signal in FIG. 2 for observation.

As previously discussed in FIG. 2, the one or more selection control signals 208(1)-(M) control the observation signal selection circuit 204 to select the observation signal 210 among the plurality of electronic input signals 102(1)-102(N). In this regard, FIG. 4 is a schematic diagram of an exemplary observation signal selection circuit 204(1) configured to utilize a plurality of low-distortion MUXs 400(1)-400(X) to select the high-frequency clock signal 102(2) in FIG. 2 for observation. Common elements between FIGS. 2 and 4 are shown therein with common element numbers, thus will not be re-described herein.

With reference to FIG. 4, in a non-limiting example, the plurality of low-distortion MUXs 400(1)-400(X) are two-to-one (2-to-1) MUXs configured to each receive two MUX input signals (not shown) and provide one of the two MUX input signals as a MUX output signal (not shown). The observation signal selection circuit 204(1) receives the plurality of electronic input signals 102(1)-102(N) as the observation signal selection circuit 204 does in FIG. 2. The plurality of low-distortion MUXs 400(1)-400(X) in the observation signal selection circuit 204(1) are disposed according a binary tree structure 402. The plurality of low-distortion MUXs 400(1)-400(X) are organized into a plurality of tree levels 404(1)-404(M), wherein the tree level 404(1) and the tree level 404(M) represent a bottom and a top of the binary tree structure 402, respectively. In this regard, the plurality of electronic input signals 102(1)-102(N) are provided to the tree level 404(1). The number of the plurality of tree levels 404(1)-404(M) ((M)=⌈log$_2$(N)⌉), wherein N is equal to the number of the plurality of electronic input signals 102(1)-102(N). In a non-limiting example, unused electronic input signals (not shown) for an incomplete binary tree may be tied to a constant signal source (not shown). The number of low-distortion MUXs in the tree level 404(1)=⌈(N/2)⌉. The number of low-distortion MUXs in the tree level 404(Y) (1<Y≤X)=⌈(The number of low-distortion MUXs in the tree level (Y−1))/2)⌉. In a non-limiting example, if ten (10) electronic input signals 102(1)-102(10) (N=10) are provided to the observation signal selection circuit 204(1), the binary tree structure 402 has the following characteristics:

M=⌈log$_2$(N)⌉=⌈log$_2$(N)⌉=4 (four), indicating that there are 4 tree levels 404(1)-404(4) in the binary tree structure 402.

The number of low-distortion MUXs in the tree level 404(1)=⌈(N/2)⌉=⌈(10/2)⌉=5 (five).

The number of low-distortion MUXs in the tree level 404(2)=⌈(The number of low-distortion MUXs in the tree level 404(1))/2)⌉=⌈(5/2)⌉=3 (three).

The number of low-distortion MUXs in the tree level 404(3)=⌈(The number of low-distortion MUXs in the tree level 404(2))/2)⌉=⌈(3/2)⌉=2 (two).

The number of low-distortion MUXs in the tree level 404(4)=⌈(The number of low-distortion MUXs in the tree level 404(3))/2)⌉=⌈(1/2)⌉=1 (one).

With continuing reference to FIG. 4, the plurality of tree levels 404(1)-404(M) receives the one or more selection control signals 208(1)-208(M). As previously discussed in FIG. 2, the one or more selection control signals 208(1)-(M) controls the observation signal selection circuit 204 to select the observation signal 210 among the plurality of electronic input signals 102(1)-102(N). In a non-limiting example, the observation signal 210 is the high-frequency clock signal 102(2).

Figure 5:
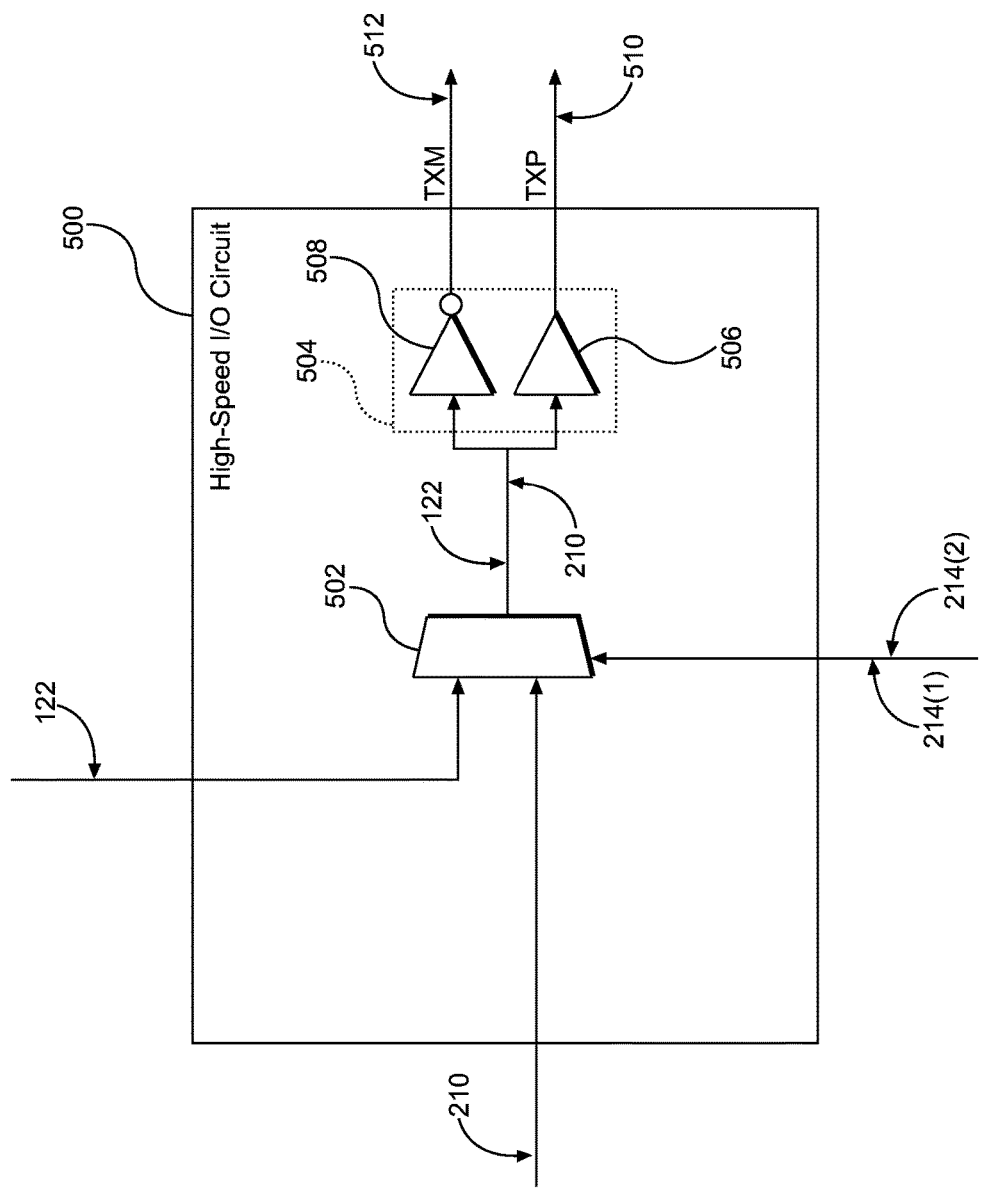
FIG. 5 is a schematic diagram of an exemplary high-speed input/output (I/O) circuit configured to switch between transmission of an observation signal and transmission of a serialized data signal in FIG. 2.

As previously discussed in FIG. 2, the high-speed I/O circuit 110 must be controlled properly to switch between transmission of the observation signal 210 and transmission of the serialized data signal 122. In this regard, FIG. 5 is a schematic diagram of an exemplary high-speed I/O circuit 500 configured to switch between transmission of the observation signal 210 and transmission of the serialized data signal 122 in FIG. 2. Elements of FIG. 2 are referenced in connection with FIG. 5 and will not be re-described herein.

With reference to FIG. 5, the high-speed I/O circuit 500 comprises a low-distortion MUX 502, which is a 2-to-1 MUX. The low-distortion MUX 502 is coupled to the observation signal selection circuit 204, the signal control logic 206, and the SerDes logic 116. The low-distortion MUX 502 receives the observation signal 210 and transmission of the serialized data signal 122 as a first input signal and a second input signal, respectively. The low-distortion MUX 502 is configured to output the observation signal 210 to an analog transmitter 504 in response to receiving the first output control signal 214(1). The low-distortion MUX 502 is also configured to output the serialized data signal 122 to the analog transmitter 504 in response to receiving the second output control signal 214(2). In this regard, if the first output control signal 214(1) is provided to the low-distortion MUX 502, then the observation signal 210 is the MUX output signal. In contrast, if the second output control signal 214(2) is provided to the low-distortion MUX 502, then the serialized data signal 122 is the MUX output signal. Hence, the high-speed I/O circuit 500 can be controlled properly to switch between transmission of the observation signal 210 and transmission of the serialized data signal 122.

With continuing reference to FIG. 5, the analog transmitter 504 comprises a transmission circuit 506 and an inversed transmission circuit 508. The transmission circuit 506 is configured to transmit a positive analog signal (TXP) 510 and the inversed transmission circuit 508 is configured to transmit a negative analog signal (TXM) 512. Externally connected equipment (e.g., a signal analyzer) may thus receive the TXP 510 and/or the TXM 512, whereby the observation signal 210 may be observed and analyzed.

High-frequency signal observations in electronic systems according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
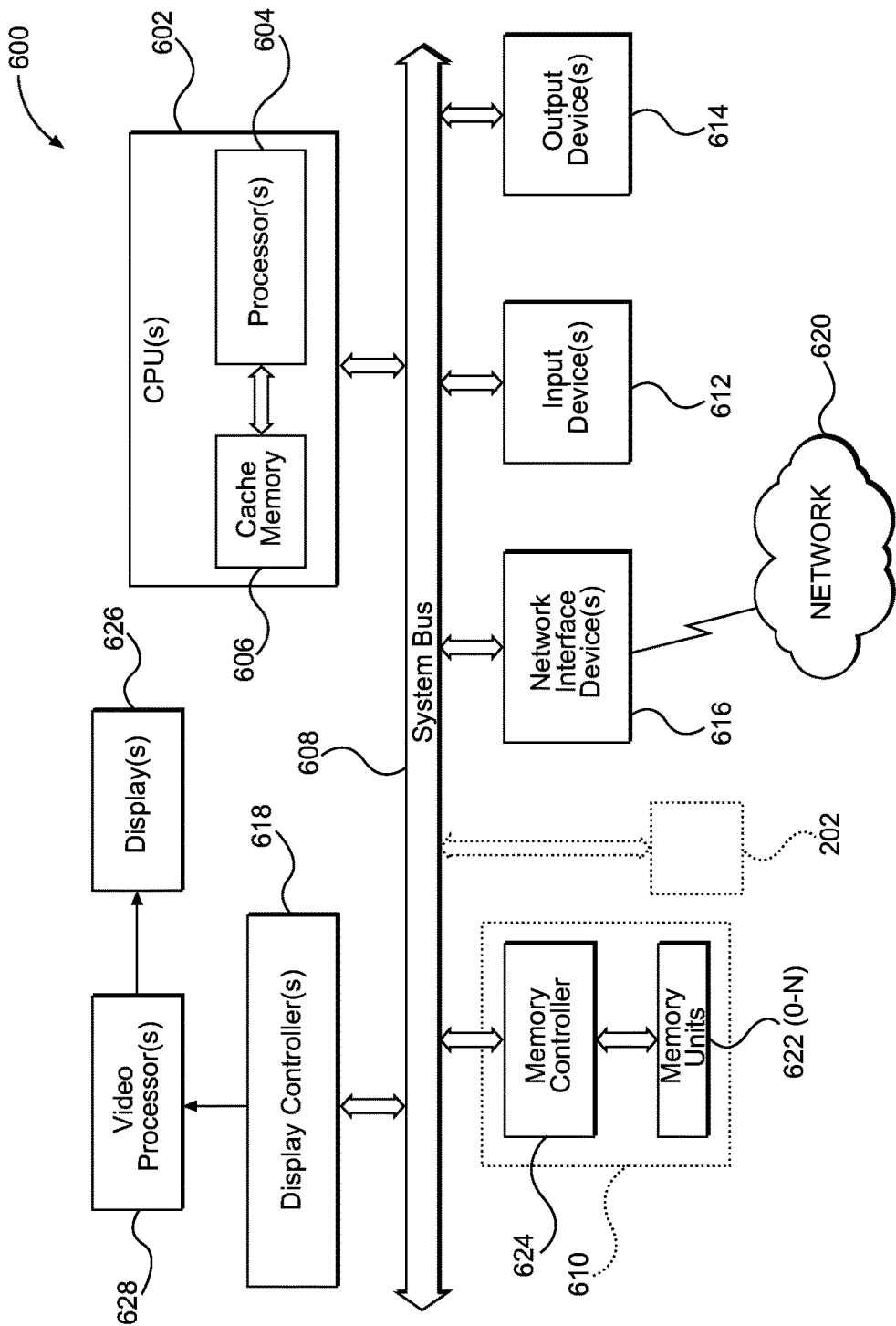
FIG. 6 illustrates an example of a processor-based system that can employ the high-frequency signal observation circuit illustrated in FIG. 2.

In this regard, FIG. 6 illustrates an example of a processor-based system 600 that can employ the high-frequency signal observation circuit 202 illustrated in FIG. 2. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608, to which the high-frequency signal observation circuit 202 may be connected. As is well known, the CPU(s) 602 communicates with these other devices by exchanging address, control, and data information over the system bus 608. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 610, one or more input devices 612, one or more output devices 614, one or more network interface devices 616, and one or more display controllers 618, as examples. The input device(s) 612 can include any type of input device, including but not limited to input keys, switches, voice processors, etc. The output device(s) 614 can include any type of output device, including but not limited to audio, video, other visual indicators, etc. The network interface device(s) 616 can be any device configured to allow exchange of data to and from a network 620. The network 620 can be any type of network, including but not limited to a wired or wireless network, a private or public network, a local area network (LAN), a wireless local area network (WLAN), a wide area network (WAN), a BLUETOOTH™ network, or the Internet. The network interface device(s) 616 can be configured to support any type of communications protocol desired. The memory system 610 can include one or more memory units 622(0-N) and a memory controller 624.

The CPU(s) 602 may also be configured to access the display controller(s) 618 over the system bus 608 to control information sent to one or more displays 626. The display controller(s) 618 sends information to the display(s) 626 to be displayed via one or more video processors 628, which process the information to be displayed into a format suitable for the display(s) 626. The display(s) 626 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A high-frequency signal observation circuit, comprising:
   an observation signal selection circuit comprising a plurality of low-distortion multiplexers (MUXs) disposed according to a binary tree structure, wherein the observation signal selection circuit is communicatively coupled to a high-speed input/output (I/O) circuit via a bypass data path and configured to receive a plurality of electronic input signals; and a signal control logic coupled to the observation signal selection circuit and the high-speed I/O circuit, wherein the signal control logic is configured to:
provide one or more selection control signals to the observation signal selection circuit to select an observation signal among the plurality of electronic input signals;
control the observation signal selection circuit to provide the observation signal to the high-speed I/O circuit via the bypass data path; and
provide a first output control signal to the high-speed I/O circuit to output the observation signal as an electronic output signal.

2. The high-frequency signal observation circuit of claim 1, wherein the plurality of electronic input signals comprises one or more control signals.

3. The high-frequency signal observation circuit of claim 2, wherein the one or more control signals comprise at least one high-frequency clock signal configured to control a serializer/deserializer (SerDes) logic coupled to the high-speed I/O circuit.

4. The high-frequency signal observation circuit of claim 3, wherein the SerDes logic is configured to:
generate a serialized data signal based on the at least one high-frequency clock signal; and
provide the serialized data signal to the high-speed I/O circuit.

5. The high-frequency signal observation circuit of claim 4, wherein the signal control logic is further configured to provide a second output control signal to the high-speed I/O circuit to output the serialized data signal as the electronic output signal.

6. The high-frequency signal observation circuit of claim 4, wherein the bypass data path is configured to bypass the SerDes logic.

7. The high-frequency signal observation circuit of claim 1, wherein the high-speed I/O circuit is selected from the group consisting of: a peripheral component interconnect (PCI) express (PCIe) circuit; a universal serial bus (USB) circuit; a universal flash storage (UFS) circuit; a high definition multimedia interface (HDMI) circuit; and a serial advanced technology attachment (SATA) circuit.

8. The high-frequency signal observation circuit of claim 1 integrated into an integrated circuit (IC).

9. The high-frequency signal observation circuit of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

10. A high-frequency signal observation circuit, comprising:
a means for selecting an observation signal comprising a plurality of low-distortion multiplexers (MUXs) disposed according to a binary tree structure, wherein the means for selecting an observation signal is communicatively coupled to a high-speed input/output (I/O) circuit via a bypass data path and configured to receive a plurality of electronic input signals; and a means for providing a control signal coupled to the means for selecting the observation signal and the high-speed I/O circuit, wherein the means for providing the control signal is configured to:
provide one or more selection control signals to the means for selecting the observation signal to select the observation signal among the plurality of electronic input signals;
control the means for selecting the observation signal to provide the observation signal to the high-speed I/O circuit via the bypass data path; and
provide a first output control signal to the high-speed I/O circuit to output the observation signal as an electronic output signal.

11. A method for observing a high-frequency signal, comprising:
configuring an observation signal selection circuit to receive a plurality of electronic input signals;
providing one or more selection control signals from a signal control logic to the observation signal selection circuit to select an observation signal among the plurality of electronic input signals using a plurality of low-distortion multiplexers (MUXs) arranged in a binary tree structure;
outputting the observation signal to a high-speed input/output (I/O) circuit via a bypass data path; and
providing a first output control signal from the signal control logic to the high-speed I/O circuit to output the observation signal.

12. The method of claim 11, further comprising configuring the observation signal selection circuit to receive at least one high-frequency clock signal configured to control a serializer/deserializer (SerDes) logic.

13. The method of claim 12, comprising providing the one or more selection control signals to control the observation signal selection circuit to select the at least one high-frequency clock signal as the observation signal.

14. The method of claim 12, comprising outputting the observation signal to the high-speed I/O circuit via the bypass data path that bypasses the SerDes logic.

15. An electronic system configured to enable high-frequency signal observation, comprising:
a high-frequency signal observation circuit, comprising:
a high-speed input/output (I/O) circuit configured to output an electronic output signal from an electronic system;
an observation signal selection circuit comprising a plurality of low-distortion multiplexers (MUXs) disposed according to a binary tree structure, wherein the observation signal selection circuit is coupled to the high-speed I/O circuit via a bypass data path and configured to receive a plurality of electronic input signals from the electronic system; and
a signal control logic coupled to the observation signal selection circuit and the high-speed I/O circuit, wherein the signal control logic is configured to:
provide one or more selection control signals to the observation signal selection circuit to select an observation signal among the plurality of electronic input signals;
control the observation signal selection circuit to provide the observation signal to the high-speed I/O circuit via the bypass data path; and
provide a first output control signal to the high-speed I/O circuit to output the observation signal as the electronic output signal.

16. The electronic system of claim 15, further comprising:
a serializer/deserializer (SerDes) logic coupled to the high-speed I/O circuit, wherein the SerDes logic is configured to:
   receive at least one parallelized data input signal and at least one high-frequency clock signal from the electronic system, wherein the at least one high-frequency clock signal is among the plurality of electronic input signals;
   generate a serialized data signal based on the at least one parallelized data input signal and the at least one high-frequency clock signal; and
   provide the serialized data signal to the high-speed I/O circuit; and
a debug signal multiplexer (MUX) circuit configured to:
   receive the plurality of electronic input signals from the electronic system;
   generate a combined debug signal comprising the plurality of electronic input signals; and
   provide the combined debug signal to a debug interface comprised in the electronic system.

17. The electronic system of claim 16, wherein the debug interface is a universal serial bus (USB) debug interface or a peripheral component interconnect express (PCIe) debug interface.

18. The electronic system of claim 16, wherein the bypass data path is configured to bypass the SerDes logic.

19. The electronic system of claim 16, wherein the bypass data path is utilized to perform a joint test action group (JTAG) boundary scan.

20. The electronic system of claim 15, wherein the high-speed I/O circuit is selected from the group consisting of: a peripheral component interconnect (PCI) express (PCIe) circuit; a universal serial bus (USB) circuit; a universal flash storage (UFS) circuit; a high definition multimedia interface (HDMI) circuit; and a serial advanced technology attachment (SATA) circuit.

21. The electronic system of claim 16, wherein the signal control logic is further configured to provide a second output control signal to the high-speed I/O circuit to output the serialized data signal as the electronic output signal.

22. The electronic system of claim 21, wherein the high-speed I/O circuit comprises:
   an analog transmitter configured to output a positive analog signal (TXP) and a negative analog signal (TXM); and
   a low-distortion MUX coupled to the observation signal selection circuit, the signal control logic, and the SerDes logic, wherein the low-distortion MUX is configured to:
      receive the observation signal from the observation signal selection circuit as a first input signal;
      receive the serialized data signal from the SerDes logic as a second input signal;
      output the observation signal to the analog transmitter in response to receiving the first output control signal; and
      output the serialized data signal to the analog transmitter in response to receiving the second output control signal from the signal control logic.

23. The electronic system of claim 15, wherein the signal control logic is provided as a programmable register.

* * * * *